United States Patent
Lee

(10) Patent No.: US 6,903,428 B2
(45) Date of Patent: Jun. 7, 2005

(54) SEMICONDUCTOR DEVICE CAPABLE OF PREVENTING A PATTERN COLLAPSE

(75) Inventor: Sung-Kwon Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/630,041

(22) Filed: Jul. 30, 2003

(65) Prior Publication Data

US 2004/0124411 A1 Jul. 1, 2004

(30) Foreign Application Priority Data

Dec. 26, 2002 (KR) .................................. 10-2002-0084591

(51) Int. Cl.$^7$ ............................................. H01L 21/027
(52) U.S. Cl. ........................ 257/401; 257/618; 257/620
(58) Field of Search ................................. 257/618, 620, 257/401; 438/926, 941

(56) References Cited

U.S. PATENT DOCUMENTS

| | | | | | |
|---|---|---|---|---|---|
| 5,066,997 A | * | 11/1991 | Sakurai et al. | ............... | 257/211 |
| 5,616,931 A | * | 4/1997 | Nakamura et al. | ............ | 257/48 |
| 5,867,434 A | * | 2/1999 | Oh et al. | ..................... | 365/200 |
| 6,128,209 A | * | 10/2000 | Kuroki | ......................... | 365/63 |
| 6,365,928 B1 | | 4/2002 | Yang et al. | | |
| 6,461,941 B2 | * | 10/2002 | Kim | ............................. | 438/462 |
| 6,522,007 B2 | | 2/2003 | Kouno et al. | | |
| 6,727,028 B2 | * | 4/2004 | Kotani et al. | .................. | 430/5 |
| 6,784,051 B2 | * | 8/2004 | Lee | ............................ | 438/244 |

FOREIGN PATENT DOCUMENTS

| KR | 2002-0052609 | 7/2002 |
|---|---|---|
| KR | 10-2002-0084591 | 5/2003 |

OTHER PUBLICATIONS

Notice of Preliminary Rejection issued by the Korean Intellectual Property Office dated Oct. 18, 2004.

* cited by examiner

Primary Examiner—Tom Thomas
Assistant Examiner—N. Drew Richards
(74) Attorney, Agent, or Firm—Marshall, Gerstein & Borun LLP

(57) ABSTRACT

A semiconductor device is disclosed that is capable of preventing a pattern collapse phenomenon in a cell edge area in which a pattern is more fragile. The semiconductor device has a lower pattern density in an edge area than in a central area of a wafer and includes a plurality of bar-type patterns allocated at a predetermined distance in the central area of the wafer; a plurality of dummy patterns formed in the edge area; and a plurality of a connection pattern for coupling at least two of the bar-type patterns to each other, wherein the connection patterns of the plurality of dummy patterns offset or staggered with respect to each other to form a disconnected zigzag pattern.

8 Claims, 5 Drawing Sheets

SEMICONDUCTOR DEVICE CAPABLE OF PREVENTING A PATTERN COLLAPSE

TECHNICAL FIELD

A semiconductor device is disclosed which is capable of preventing pattern collapse in an edge area on a semiconductor wafer.

DESCRIPTION OF RELATED ART

There are some incidentally occurring problems in manufacturing processes as a semiconductor device is highly integrated, and one of which is a pattern defect generated in a cell edge area of a semiconductor memory device.

For instance, in such manufacturing process for forming multiple patterns like isolated bar-type pattern composing the semiconductor device, a pattern formation process is enforced to minimize a proximity effect generated in a cell edge area during a photo-lithography process. Herein, as the proximity effect is a kind of skin effects, meaning that a density of a current flowing through each conductive material is changed in response to a direction, amount, or a frequency of the current when a plurality of the conductive materials are closely arranged. For an effective pattern formation in cell edge area, dummy patterns are formed in the same manner of forming line patterns in the cell edge area.

Due to a current trend of high integration of semiconductor devices, bar-type patterns are formed in the cell edge area through the same condition of forming the line patterns in a cell center area in order to improve line width uniformity.

A semiconductor device is therefore needed that is capable of preventing a pattern collapse phenomenon in an area, where a pattern becomes fragile, for instance, in a cell edge area.

SUMMARY OF THE DISCLOSURE

A disclosed semiconductor device comprises a lower pattern density in an edge area than in a central area of a wafer; a plurality of bar-type patterns allocated at a predetermined distance in the central area of the wafer; a plurality of dummy patterns formed in the edge area; and a plurality of a connection pattern for coupling at least two of the bar-type patterns to each other, wherein the connection patterns of the plurality of dummy patterns are disposed offset from one another in a zigzag fashion.

BRIEF DESCRIPTION OF THE DRAWINGS

The above and other features of the disclosed semiconductor devices will become apparent from the following description of preferred embodiments taken in conjunction with the accompanying drawings, wherein.

DETAILED DESCRIPTION OF THE PRESENTLY PREFERRED EMBODIMENTS

Figure 1:
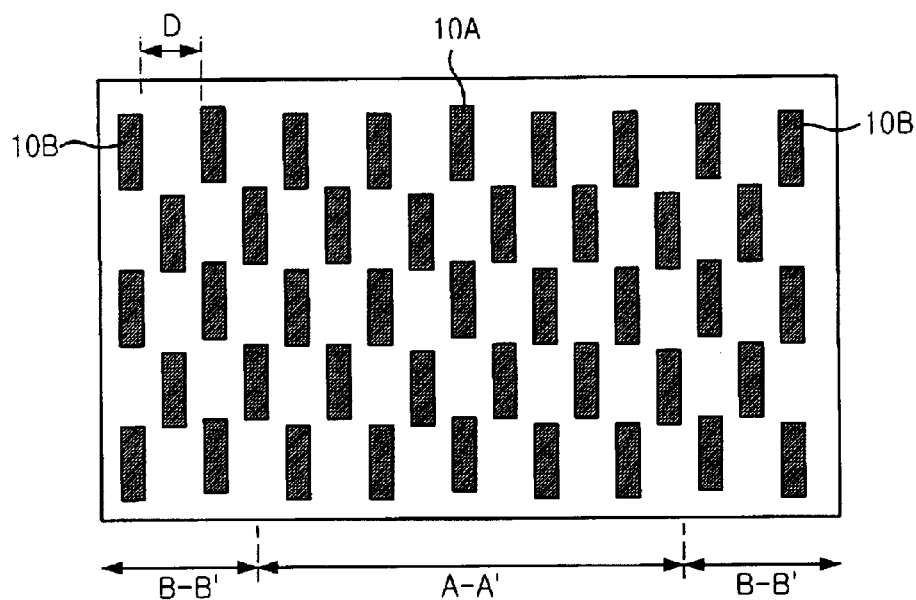
FIG. 1 is a plan view illustrating bar-type patterns formed in cell center and edge areas of a conventional semiconductor device.
Figure 2:
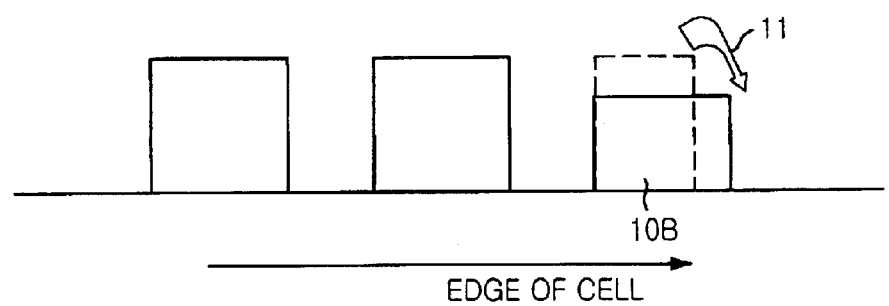
FIG. 2 is a diagram showing a pattern collapse phenomenon in the cell edge area of the conventional semiconductor device.
Figure 3:
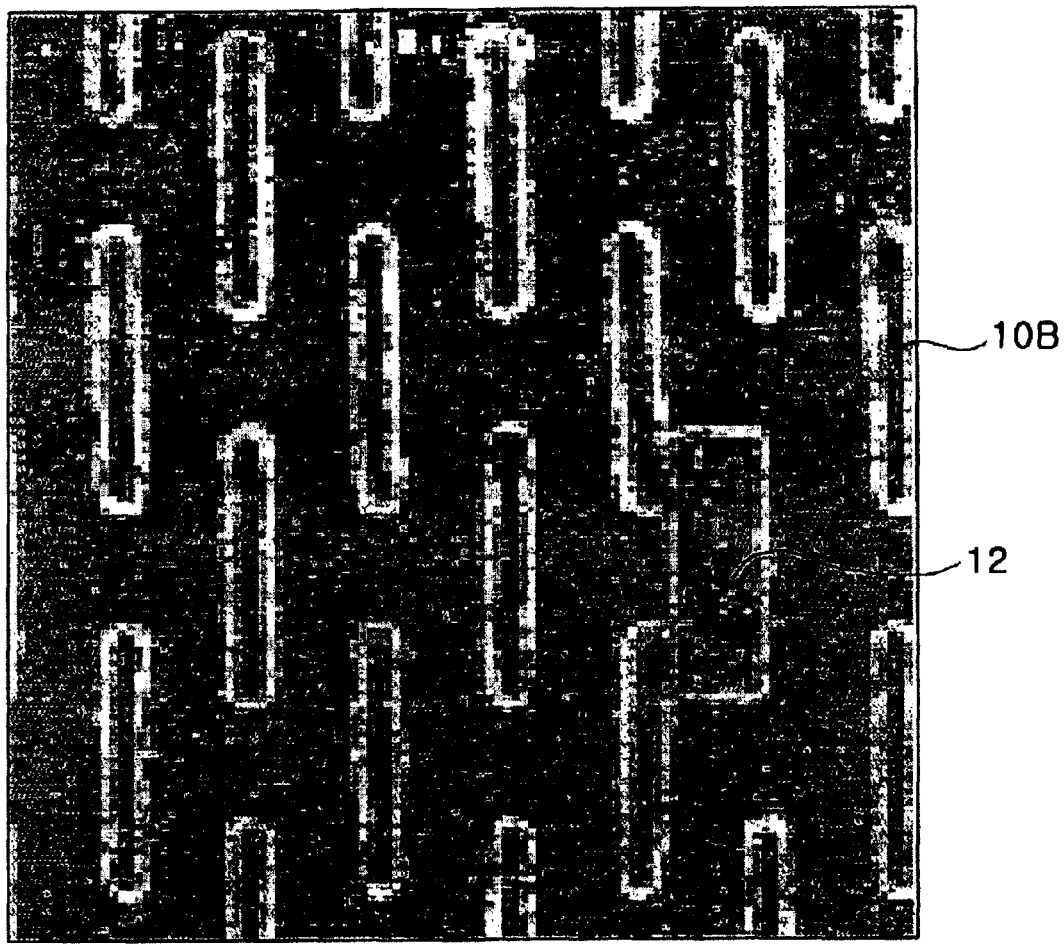
FIG. 3 is a scanning electron microscope SEM micrograph showing a plan view of the pattern collapse of a dummy pattern in the cell edge area of the conventional semiconductor device.

Referring to FIGS. 1–4B, a conventional semiconductor device is generally shown. FIG. 1 is a plan view illustrating bar-type patterns formed in cell center and edge areas of a conventional semiconductor device. FIG. 2 is a explanatory diagram for describing a pattern collapse in the cell edge area of the conventional semiconductor device, and FIG. 3 is a diagram of a scanning electron microscope SEM micrograph showing a plane view of the pattern collapse of a dummy pattern in the cell edge area in where the bar-type patterns are formed.

As shown in FIG. 1, a plurality of the bar-type patterns 10A are formed with a predetermined distance D in the cell center and edge areas. A plurality of the dummy patterns 10B are formed in the cell edge area.

The function of the dummy pattern 10B is to help form a main pattern, and it is very important and certainly necessary for preventing a collapse of the main pattern.

However, for a device of which the minimum feature size is below about 100 nm, a thickness of a photo-resist must be increased with a consideration of etch resistance for a line width. The pattern collapse is a more critical issue at the isolated bar-type pattern than at a straight pattern. Pattern collapse generally occurs in a case that a ratio of a thickness of the photo-resist to a critical dimension is under 3:1. Especially, the repeated dummy patterns 10B originally designed to be the same size of the pattern formed throughout the cell area become smaller because of the proximity effect in the cell edge area, referring to a reference numeral '11' shown in FIG. 2. As a result, the pattern collapse, referring to a reference numeral '12' shown in FIG. 3, of the photo-resist becomes more critical.

Figure 4A:
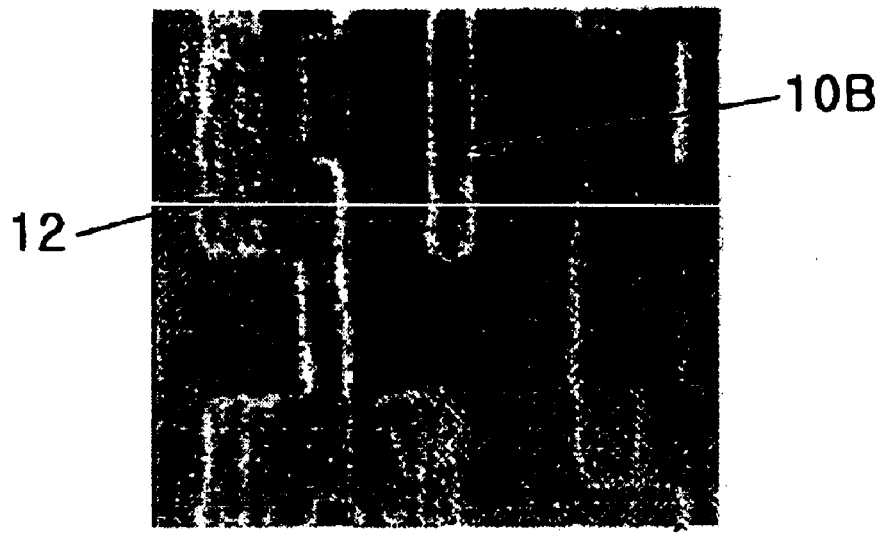
FIGS. 4A and 4B are SEM micrographs showing the pattern collapse of the bar pattern in the cell edge area of the conventional semiconductor device.
Figure 4B:
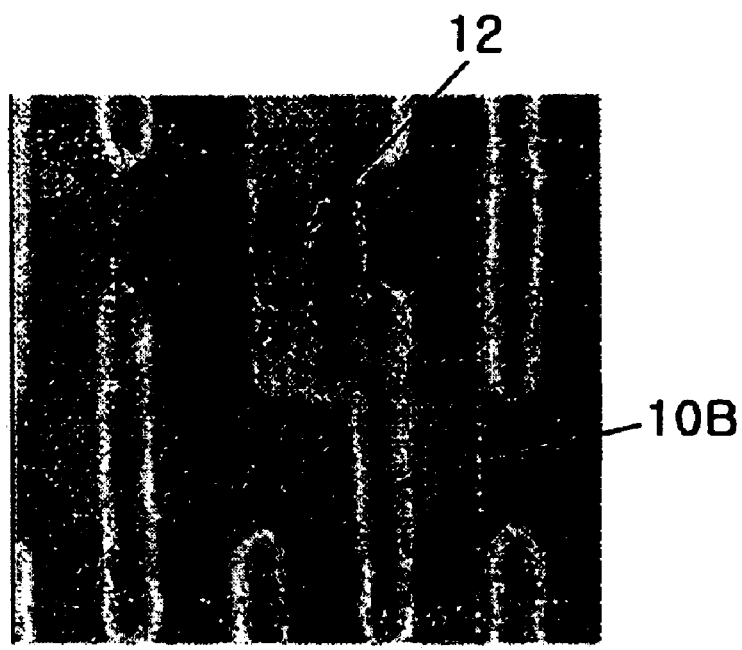

FIGS. 4A and 4B are diagram of SEM micrographs showing the pattern collapse of the bar pattern in the cell edge area. As shown, it is possible to confirm that the dummy pattern 10B collapse in cell edge area in several forms due to the proximity effect.

Figure 5:
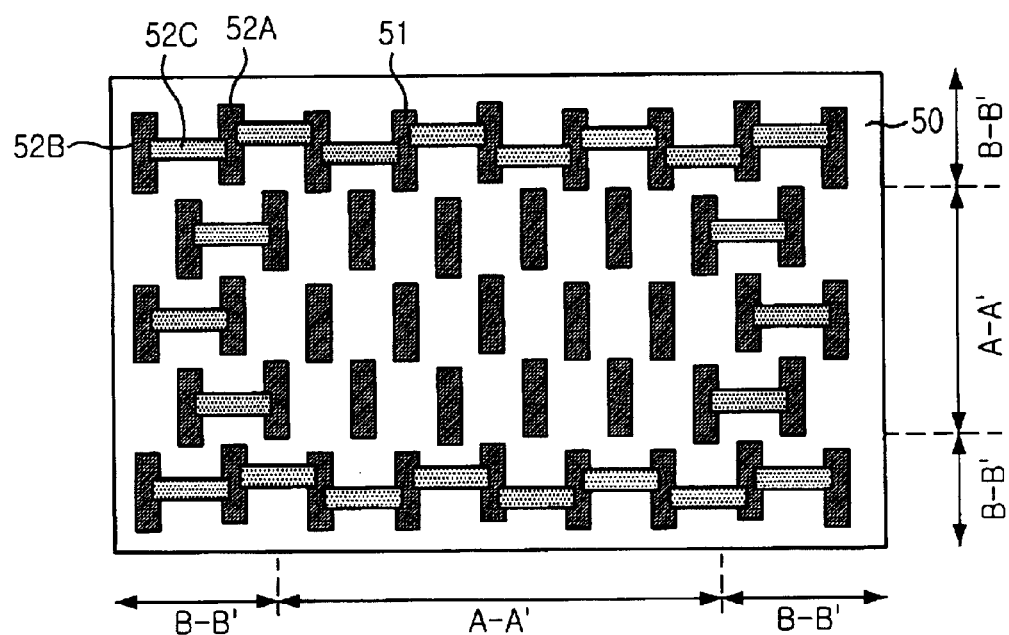
FIG. 5 is a plan view of a disclosed semiconductor device completed with a predetermined process for forming a bar pattern in accordance with a preferred embodiment.
Figure 6:
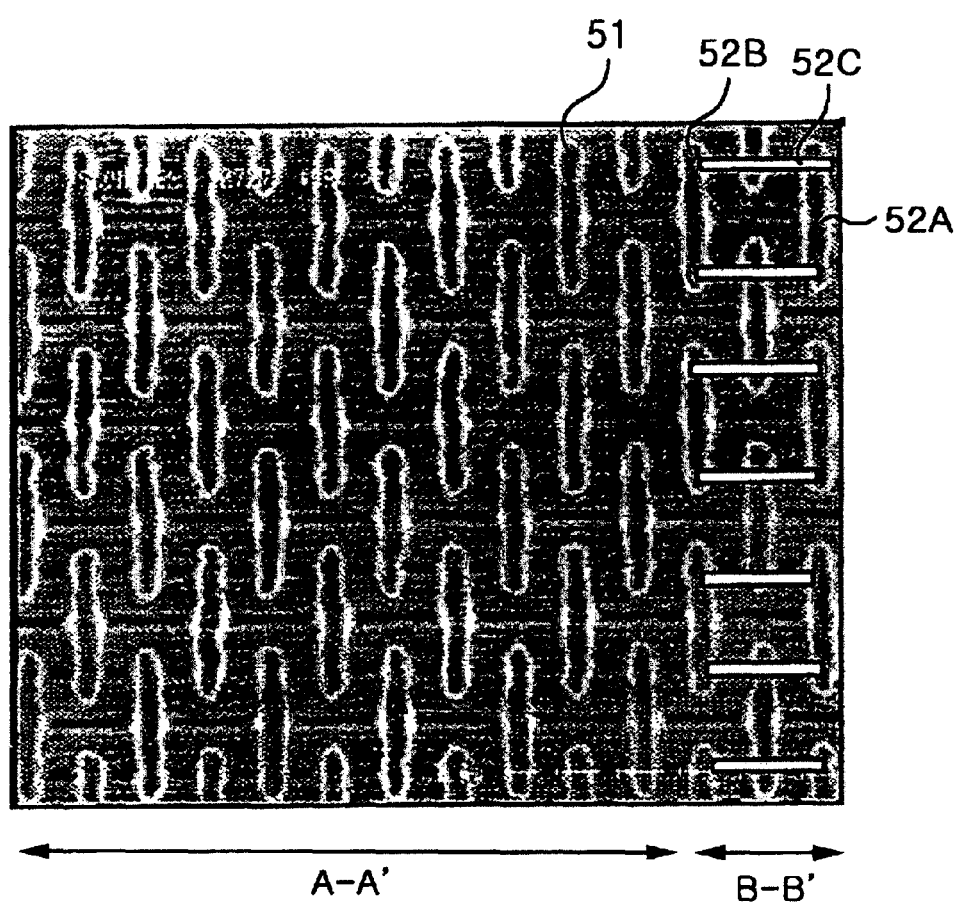
FIG. 6 is a SEM micrograph showing a plan view of the semiconductor device described in FIG. 5.

Referring to FIGS. 5 and 6, a semiconductor device capable of preventing pattern collapse is generally shown. The disclosed device is designed under the basic principle that a pattern collapse phenomenon can be effectively overcome in case that a contact surface area between a pattern and a lower layer, e.g., an insulation layer, is large. For minimizing a proximity effect that occurs in a cell edge area by limitation of photo-lithography, at least several to dozens of dummy patterns are formed in the cell edge area and these dummy patterns have a similar site to bar-patterns formed in the whole cell area. Also, there are conditions to form effectively isolated bar-patterns minimized with the proximity effect. First, isolated bar patterns formed in the cell edge area are the dummy patterns. Furthermore, dummy patterns are regularly connected to each other in order to effectively present the pattern collapse among the dummy patterns and increase the contact surface area of the bar-pattern with the lower layer.

Hereinafter, a disclosed semiconductor device will be described in detail referring to the accompanying drawings.

FIG. 5 is a plan view of a semiconductor device completed with a predetermined process for forming a bar pattern in accordance with a preferred embodiment.

As shown, in the disclosed semiconductor device, there is a semiconductor memory cell 50 of which size gets smaller because the bar-pattern has less topology in a cell edge area B–B', than in a cell center area A–A'. The semiconductor memory device includes a plurality of the active bar-type patterns 51 formed in the cell center area A–A' except for the cell edge area B–B', and a connection pattern 52C connecting at least two dummy bar-type patterns 52A and 52B to each other for protecting the bar patterns 52A and 52B from being collapsed. Herein, the dummy bar-type patterns 52A and 52B are formed in the cell edge area B–B' of the semiconductor memory cell 50. Also, the bar-type patterns 52A and 52B and the connection pattern 52c are a dummy pattern.

It is also noted that the cell edge area B–B' has a lower topology because of a lower pattern density in the cell edge area B–B' than in the cell center area A–A'.

The dummy pattern is formed through the use of the same photo-lithography using the same material for the bar-type pattern 51 in the cell center area A–A'. The cell edge area B–B' can be called a dummy area.

The bar-type pattern 51 is typically used not only in a landing plug contact LPC process for making a plug contacted to an active area of a wafer but also in a device isolation process.

The dummy patterns, more concretely, the bar-type patterns 52A and 52B in the cell edge area B–B', have the same size of the bar-type pattern 51 in the cell center area A–A'. Particularly, the allowable size of the dummy pattern ranges from about 80% to about 120% of the bar-type pattern 51 size.

It is possible to apply this approach to a core memory area and a periphery area in addition to the cell center area A–A' and the cell edge area B–B'.

As shown in FIG. 5, the parallel dummy bar-type patterns 52A and 52B have less adhesive force to the layer beneath than those in the cell center area A–A'. The dummy patterns produced by connecting at least the two bar-type patterns 52A and 52B to each other through the perpendicular connection pattern 52C for increasing the contact surface area with the lower layer enhance the adhesive force. The connection patterns 52C are not a straight pattern but are offset or staggered with respect to each other to form a zigzag pattern. Namely, a plurality of the connection patterns 52C are allocated in a zigzag pattern or offset from one another for connecting the two bar-type patterns in the cell edge area B–B'. In other words, adjacent connecting patterns 52C are staggered or offset and do not form a straight line as they extend along the wafer 50 as shown in FIG. 5.

Thus, it is possible to minimize the pattern collapse occurred by the proximity effect.

FIG. 6 is a diagram of a SEM micrograph showing a plane view of the semiconductor device described in FIG. 5.

As shown, there are formed a plurality of the dummy patterns of which surface area contacted to the lower layer is increased by connecting the two bar-type patterns 52A and 52B to each other throughout the use of the connection pattern 52C in the cell edge area B–B'.

As verified from FIG. 6, the pattern collapse is not occurred by forming the dummy pattern in the cell edge area B–B' with the specific design described in FIG. 5.

In accordance with the preferred embodiment, the bar-type dummy patterns are formed by connecting at least two bar-type patterns through the use of the connection pattern in the cell edge area to thereby increase the contact area of the bar-type dummy patterns with the lower layer. This increased contact area provides a further effect of preventing the pattern collapse in the cell edge area.

For example, the preferred embodiment provides an example of a cell using a device isolation layer and a landing plug contact as the bar-type pattern. However, the bar-type pattern can be also applied not only to a conductibility pattern such as a bit line, a word line, a metal wire, and so on but also to other various types of patterns.

While embodiments have been shown and disclosed, it will be apparent to those skilled in the art that various changes and modification may be made without departing from the spirit and scope of this disclosure and the following claims.

What is claimed is:

1. A semiconductor device having a lower pattern density in an edge area than in a central area of a wafer, comprising:
   a plurality of parallel but staggered active bar-type patterns formed on the central area of the wafer;
   a plurality of parallel but staggered dummy bar-type patterns formed on the edge area of the wafer; and
   a plurality of a connection patterns extending perpendicular to the active bar-type and dummy bar-type patterns; at least one connection pattern adapted to couple at least two of the staggered and adjacent active bar-type patterns to each other and a plurality of other connection patterns each adapted to couple two of the staggered and adjacent dummy bar-type patterns to each other;
   wherein the connection patterns coupling two of the plurality of dummy patterns together are parallel to each other but staggered with respect to each other.

2. The semiconductor device as recited in claim 1, wherein the active bar-type patterns are for a device isolation layer or a landing plug contact.

3. The semiconductor device as recited in claim 2, wherein the dummy pattern includes:
   a first dummy bar-type pattern;
   a second dummy bar-type pattern allocated at a predetermined distance from the first dummy bar-type pattern; and
   the connection pattern is adapted to connect the first bar-type pattern to the second bar-type pattern.

4. The semiconductor device as recited in claim 3, wherein the first and the second dummy bar-type patterns are in a range of about 80% to about 120% of the size of the active bar-type patterns in the central area of the wafer.

5. The semiconductor device as recited in claim 1, wherein the dummy bar-type patterns include N number of dummy bar-type patterns disposed a predetermined distance between themselves, where N is a positive integer, and wherein at least two dummy bar-type patterns of the N number of dummy bar-type patterns are connected.

6. The semiconductor device as recited in claim 5, wherein a size of the dummy bar-type patterns ranges from about 80% to about 120% of the size of the active bar-type patterns in the central area of the wafer.

7. The semiconductor device as recited in claim 1, wherein the central area and the edge area are a cell center area and a cell edge area, respectively.

8. The semiconductor device as recited in claim 1, wherein the central area is a core cell area and the edge area is a peripheral area.

* * * * *